United States Patent

Fischer et al.

Patent Number: 5,417,896
Date of Patent: May 23, 1995

[54] PREPARATION OF SHEET-LIKE POLYETHYLENE TEREPHTHALATE MATERIALS HAVING LITTLE SURFACE ROUGHNESS

[75] Inventors: Gerd Fischer, Bockenheim; Alfred Hagemeyer, Ludwigshafen; Hartmut Hibst, Schriesheim; Hans J. Richter, Heidelberg; Hans-Peter Schildberg, Mannheim, all of Germany; Sylvain Lazare, Leognan; Matthias Bolle, Pessac, both of France

[73] Assignee: BASF Magnetics GmbH, Mannheim, Germany

[21] Appl. No.: 99,139

[22] Filed: Jul. 29, 1993

[30] Foreign Application Priority Data

Aug. 3, 1992 [DE] Germany .................. 42 25 554.6

[51] Int. Cl.6 .................. B29C 59/16; C08J 3/28
[52] U.S. Cl. .................. 264/22; 216/65
[58] Field of Search .................. 264/22, 25; 156/628, 156/643

[56] References Cited

U.S. PATENT DOCUMENTS 4,417,948 11/1983 Mayne-Banton et al. .......... 156/643
4,868,006 9/1989 Yorkgitis et al.
5,175,043 12/1992 Yabe et al. .................. 428/156

FOREIGN PATENT DOCUMENTS 2233334 1/1991 United Kingdom.

OTHER PUBLICATIONS

Applied Physics Letters 57(8) Aug. 20, 1990, pp. 765–767.
Applied Physics Letters 55(5) Jul. 31, 1989, pp. 510–512.
App. Phys. Letters, vol. 60, No. 6, Feb. 10, 1992, pp. 674–676.
J. of App. Phys., vol. 73, No. 7, Apr. 1, 1993, pp. 3516–3524.

Primary Examiner—Mathieu D. Vargot
Attorney, Agent, or Firm—Keil & Weinkauf

[57] ABSTRACT

Sheet-like PET materials having slight surface roughness consisting of fine dot patterns in the submicron range are produced by double successive exposure of the surfaces to polarized UV light produced by a pulsed excimer laser and having planes of polarization arranged at an angle of from 20° to 90° relative to one another, and the PET films treated in this manner are used as a substrate for thin ferromagnetic metal layers.

3 Claims, 1 Drawing Sheet

PREPARATION OF SHEET-LIKE POLYETHYLENE TEREPHTHALATE MATERIALS HAVING LITTLE SURFACE ROUGHNESS

BACKGROUND OF THE INVENTION

1. Field of the Invention

The present invention relates to sheet-like polyethylene terephthalate materials having little surface roughness, a process for their preparation by successive exposure of the surfaces to two polarized UV beams produced by the decomposition of excimers, and the use of polyethylene terephthalate films treated in this manner as substrate material for thin ferromagnetic metal layers.

2. Description of Related Art

For many applications of sheet-like polyethylene terephthalate material, it is necessary to provide this material with a defined surface roughness. The roughnesses generally result in an improvement in the adhesion, for example in the case of adhesive bonds, the printability or the wetability. A roughened surface is also advantageous for stacking of this material or for winding of corresponding film webs. Polyethylene terephthalate (PET films) having a defined roughness are very important especially for the production of magnetic recording media which consist of a polymeric substrate, a coherent, thin ferromagnetic metal layer applied to the surface of the substrate by a PVD (physical vapor deposition) method and, if required, a protective layer formed on the metal layer. The surface roughness of the films ensures little wear of the magnetic layer under tribological stress due to the head. Roughening of the polymer surface also improves the adhesion between the polymer and the magnetic layer. In addition, the mechanical and chemical stability of the metal layer give rise to particular requirements with regard to the procedure. However, these problems cannot be viewed in isolation since any type of optimization of the mechanical properties of the magnetic recording media under discussion must never lead to deterioration in the magnetic properties, ie. the properties relating to information storage.

The reduction in the wear of the magnetic layer due to the tribological stress caused by the head is achieved, inter alia, by avoiding, by means of the surface roughness, direct contact between the head and the metal layer over its entire, macroscopic contact area. In order to achieve this effect, it is important for the mean spacing between the projections on the surface to be small compared with the dimensions of the macroscopic contact area of the head. The depth of the surface roughness is limited by the fact that, if said roughness is too great, the magnetic recording and playback properties of the applied layers deteriorate as a result of the signal-to-noise ratio.

In order to achieve the desired properties of the polymer films for use as a substrate of magnetic thin-layer media, films in which a defined surface roughness is produced by incorporating and applying very small particles of an inert material have been used to date (eg. EP 0 153 853). Although these films are suitable, the production of such films requires particular and expensive production methods.

The other conventional processes for the treatment of polymer surfaces in plasma, by glow discharge, corona discharge, flame application, chemical etching or ion bombardment prior to metallization can never be completely satisfactory. The insufficient controlability of the energy effect and/or residual gas control and the resulting contamination by decomposition products were particularly significant here.

The previously described processes for the UV exposure of polymer surfaces to continuous UV lamps, for example mercury vapor lamps, to improve the coatability, to improve the printability of polyolefins (US-A Pat No. 4,933,123), or to increase the adhesive strength of adhesives from polyethylene terephthalate films (JP-A 313 850/1989) also result on the other hand in an insufficient increase in the adhesion in the case of magnetic recording media having coherent metal layers. Owing to the long exposure times with continuous UV lamps, of the order of magnitude of a few minutes, the process is very time-consuming and does not permit high processing speeds.

It is also known that a periodic dot pattern or ripples can be produced on the surface of stretched PET films by exposure to unpolarized UV light of an excimer laser (E. Arhenholz et al., Appl. Phys. A 53 (1991), 330). These structures occur in an energy range in which the exposure to the laser leads to removal of material (laser ablation). The structures have a typical spacing of a few $\mu$m and do not form completely until after exposure of the films to several pulses (at least 3 to 4). The structure spacing increases with increasing energy and number of pulses, as does the height of the structure, which may be several $\mu$m. Exposure of the PET materials to polarized UV excimer laser light with about 1,000 pulses and repetition rates of about 3 Hz at anergy densities which are within a narrow range below the ablation threshold and at which the periodic ripples were obtained on the surface is also known (Bolle et al., Appl. Phys. Lett. 60 (1992), 674). Both the height of these structures and the lateral spacing are generally too large for the films treated in this manner to be used as substrates for magnetic thin-layer media.

SUMMARY OF THE INVENTION

It is an object of the present invention to provide sheet-like polyethylene terephthalate materials having a defined but very small surface roughness, and a process which does not have the stated disadvantages and by means of which such surface roughnesses can be produced in a simple manner and without removal of material and which ensures uniformity of the properties even over large areas at high process speeds.

We have found that this object is achieved by sheet-like polyethylene terephthalate materials if the surface roughness consists of dicrete, isolated, quasiperiodic dots in the submicron range, with lateral dimensions of the dots of from 10 to 200 nm.

The present invention also relates to a process for the production of these sheet-like polyethylene terephthalate materials having surface roughnesses defined as described above by two successive exposures to linearly polarized UV radiation, the planes of polarization of the two successive exposures to a pulsed excimer laser in the wavelength range of from 150 to 400 nm making an angle of from 20° to 90° with one another.

Description of Preferred Embodiments

The PET materials possessing, according to the invention, the finely rough surface have a homogeneous density per unit area of isolated and discrete projections with the characteristic dot patterns. These structures have a diameter of from 10 to 200 nm, preferably from 10 to 100 nm. The mean spacing of the dots is less than 0.5 μm, if necessary less than 300 nm, depending on the energy and duration of action employed for their production. The structures described, in the form of small dots, occur only in a relatively narrow window of the energy density below the (wavelength- and material-dependent) ablation threshold, depending on the wavelength of the UV laser radiation and the PET material used. At a wavelength of 248 nm (KrF excimer laser) and more than 200, preferably from 200 to 4,000, pulses/unit area for the two exposures, the structures described are formed, in the case of PET films and thin PET films on Si wafers, only within the energy density range of from 1 to 15, preferably from 4 to 15, mJ/cm$^2$. At a wavelength of 193 nm(ArF excimer laser) and more than 200, preferably from 200 to 4,000, pulses/unit area for the two successive exposures, the said dot patterns are produced in the case of PET films at energy densities of from 1 to 6, preferably from 3 to 6, mJ/cm$^2$. The vertical height of the dots may be varied within certain limits via the number of incident pulses, the number of pulses at the lower ranges of the energy density in each case preferably being more than 1,500 pulses per unit area. The dot pattern produced according to the invention is much finer than the known, much greater roughness produced predominantly with unpolarized light above the ablation threshold. These structures typical of the novel materials thus differ substantially in their appearance from the conventional ripples which are produced in a known manner by UV exposure. They also differ substantially in their size from the conventional dot patterns which are obtained by UV exposure of the surface at energy densities above the ablation threshold, carried out according to the prior art. However, they are similar to the fine and uniform surface projections obtained by means of a special surface treatment of the material (particle-filled coat) and having the desired geometrical dimensions but differ fundamentally from the latter in their structure, composition and production. In contrast to the present invention, it is not a specific modification of the surface but an additionally applied intermediate layer comprising a coating in which filler particles having the suitable dimensions are embedded, ie. a completely different process.

The present invention has made it possible for PET materials to have the advantages of a roughened surface but not the disadvantages caused, according to the prior art, by a global and drastic roughening of the surface. Owing to the further reduced contact area with support elements of any kind, the novel isolated fine projections having a specified density per unit area (ie. not too close together) are more advantageous to use and to handle than the cohesive and hence denser ripples, which lead to an undesirable, substantially higher packing density of the projections.

Further advantages, details and features of the novel material and of the novel process are evident from the following description, a few embodiments and the Figures.

BEST MODE FOR CARRYING OUT THE INVENTION

Figure 1:
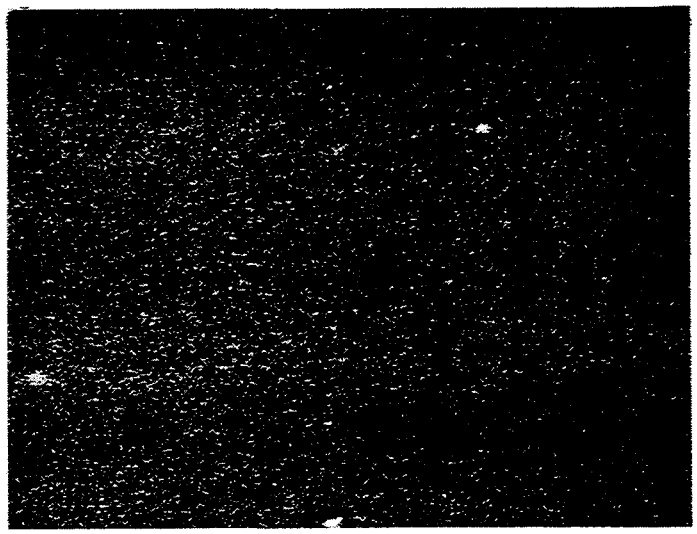
FIG. 1 shows an untreated PET surface.
Figure 2:
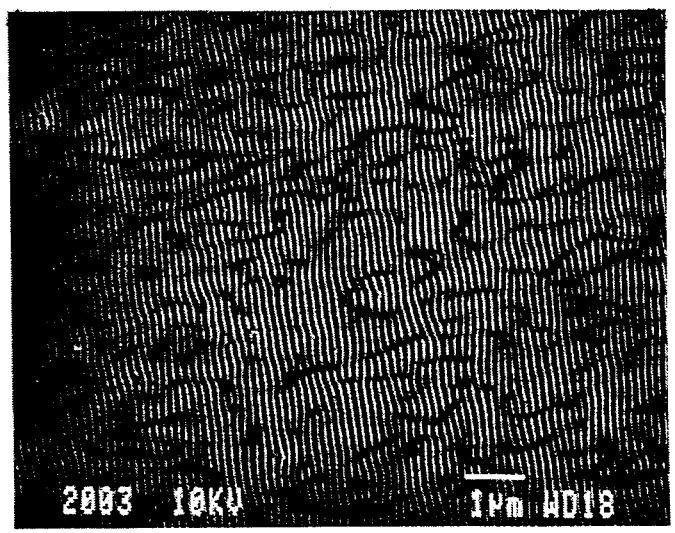
FIG. 2 shows ripples produced by simple exposure to polarized UV excimer laser radiation at energy densities below the ablation threshold and FIG. 3 shows a novel PET surface having the fine dot pattern.

The surface shown in FIG. 2 was produced by exposing a 160 nm thick PET film on a silicon wafer at 193 nm under reduced pressure with a fluence of 3 mJ/cm$^2$ and 1,000 pulses. Exposure in air gives similar results.

Figure 3:
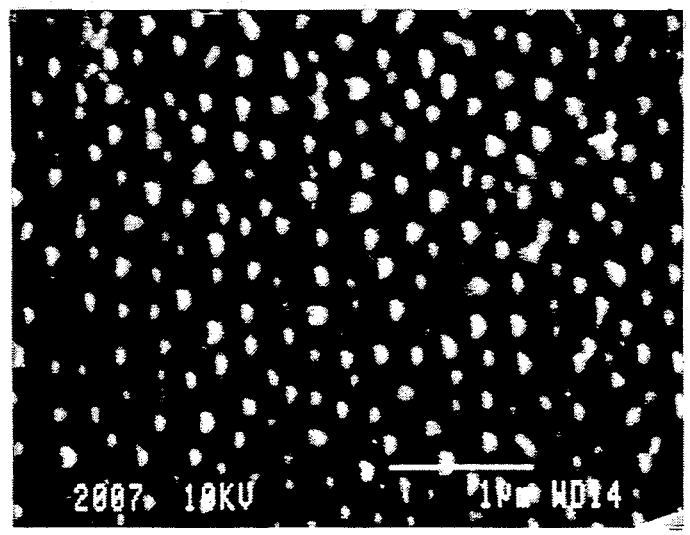

The surface shown in FIG. 3 was produced by exposing a 50 μm thick Mylar PET film at 248 nm in air to polarized UV radiation having an energy density of 7.5 mJ/cm$^2$ twice in succession with 1,000 pulses each, ie. with a total of 2,000 pulses, the sample being rotated through 90 degrees between the first and second exposures so that the planes of polarization of both exposures were at right angles to one another.

The excimer lasers used for the novel process are known. The suitable wavelengths are from 150 to 400 nm, the KrF laser having a wavelength of 248 nm and the ArF laser having a wavelength of 193 nm being preferred. The surface of the PET material was exposed twice to polarized UV radiation with from 100 to 4,000 pulses, preferably from 500 to 2,000 pulses, at an energy density which is below the ablation threshold and is from 4 to 15 mJ/cm$^2$ at 248 nm and from 3 to 6 mJ/cm$^2$ at 193 nm, the two individual exposures taking place in succession and being carried out with planes of polarization making an angle of from 20° to 90° with one another, preferably at right angles to one another.

To produce the polarized UV radiation, the excimer laser used is provided with a polarizer. When it is used for the novel process, the repetition rate of the laser is from 1 to 1,000 Hz, the suitable pulse lengths being from 10 to 100 ns.

The PET materials defined according to the invention and the finely rough surfaces obtained by the novel process are used in connection with the conditioning of PET films. They also have a uniform surface with uniform properties.

PET films treated in this manner are very useful in particular as substrate material for the production of magnetic recording material which have a coherent thin ferromagnetic metal layer as magnetic layer. These metal layers are applied to the substrate by PVD methods, the form of the surface of the substrate material, however, being an important, quality-determining factor for the adhesion of the layer to the substrate and for the wear of the layer due to the tribological stress caused by the head.

Regarding the use of the novel PET materials, the production of these magnetic thin-layer media is discussed by way of example. The PET substrates used as film webs are exposed to the UV radiation of an appropriate excimer laser by the novel method. The coherent ferromagnetic metal layer is then applied by a known procedure to a substrate pretreated in this manner. Suitable metal layers are in general cobalt-containing, for example Co—Ni—Cr, Co—Pt, Co—Ni—O or Co—Cr. Cobalt/chromium layers containing from 15 to 35 atom % of Cr, cobalt/nickel layers containing more than 10 atom % of nickel or cobalt/nickel/oxygen layers containing more than 10 atom % of nickel and from 3 to 45 atom % of oxygen are preferred. However, corresponding thin metal layers based on iron are also known and are used. These layers are produced with the aid of a PVD method, for example by vaporization, electron beam vaporization, sputtering, ion plating or application of a layer of metal components by the electric arc method. Vapor deposition and sputtering are preferred. The ferromagnetic metal layers produced in this manner are from 20 to 500 nm thick. In the case of lower layers, layer thicknesses of from 2 to 300 nm are preferred. The thickness of protective layers for improving the abrasion resistance and corrosion resistance is from 1 to 100 nm. The application of a carbon layer, oxidation of the surface of a metal layer, coating with liquid oligomers generally based on fluorine-containing polyethers, formation of oxides, nitrides or carbides of boron, of silicon, of zirconium, of hafnium and of titanium or combinations of these measures are known here.

Magnetic recording media obtained using the novel PET materials of the novel process exhibit good adhesion of the metal layer to the polymer film and a reduction in friction and an improvement in the still picture behavior. This is illustrated by the Examples which follow.

In general it is true that, in the novel process for the production of the specific finely rough surface on the PET material, roughening is effected by UV irradiation in a single process step. This is done by using two lasers connected in series and having planes of polarization which are arranged at an angle of from 20° to 90° with one another, preferably at right angles to one another, in order to avoid mechanical rotation of the sample or of the polarizer, which would result in a slow discontinuous process, and thus to permit a high throughput in continuous operation. Moreover, only the surface of the film was changed while the remainder of the film is not damaged by thermal, chemical or mechanical stresses. Owing to the use of low energy densities and short treatment times, it is possible uniformly to expose large areas with higher throughput.

Where the novel process is used for the production of magnetic thin-layer media, it is also advantageous if the production of the surface roughness of the PET films can be carried out directly before a further processing step, for example the application of a thin ferromagnetic metal layer, in one and the same process chamber. Such in situ pretreatment ensures that aging or soiling of the roughened surface does not occur and, since the radiation source is mounted outside the process chamber, the substrate pretreatment process can be easily controlled and monitored.

EXAMPLE

A commercial PET film (Mylar from DuPont) was exposed to linearly polarized UV radiation in air at 193 nm using an energy density of 3.9 mJ/cm² and 1,000 pulses. Electron micrographs show quasiperiodic ripples having a spacing of 150 nm between these ripples. The mean distance between the ripples increases with increasing wavelength and is about 200 nm at 248 nm. Since polarized radiation is used, the ripples have a preferred direction corresponding to the plane of polarization of the UV light and are almost parallel to one another (cf. FIG. 2).

The sample was then rotated through 90 degrees and was exposed again to 1,000 further pulses at 3.9 mJ/cm² using the same setup and the same parameters. Electron micrographs show a dot pattern of fine, isolated dots whose diameters are about 100 nm and whose density per unit area is from 10 to 20 dots/$\mu m^2$.

The structures are produced on exposure both in air and under reduced pressure provided that the energy density is in the stated range. Outside this window of possible energy densities, no such structures, neither ripples nor dots, are found below the ablation threshold. Via the number of incident pulses, the vertical height of the dots can be controlled and thus specifically adjusted, These fine dots found here thus differ fundamentally from the dots which are far too large and which occur above the ablation threshold even when far fewer pulses are used.

Table 1 summarizes the results. All exposures were carried out in air. The substrate is a Mylar 200 D- PET film.

TABLE 1

| Wavelength | Fluence | Polarization direction | Number of pulses | Result |
|---|---|---|---|---|
| 193 nm | 3.9 mJ/cm² | horizontal | 1,000 | horizontal ripples |
| 193 nm | 3.9 mJ/cm² | horizontal | 600 | horizontal ripples (weak) |
| 193 nm | 3.9 mJ/cm² | horizontal | 2,000 | horizontal ripples (strong) |
| 193 nm +193 nm | 3.9 mJ/cm² 3.9 mJ/cm² | horizontal vertical | 1,000 1,000 | dot pattern |
| 193 nm +193 nm | 3.9 mJ/cm² 3.9 mJ/cm² | horizontal vertical | 600 600 | dot pattern (weak) |
| 193 nm | 3.9 mJ/cm² | vertical | 1,000 | vertical ripples |
| 193 nm +193 nm | 3.9 mJ/cm² 3.9 mJ/cm² | vertical horizontal | 1,000 1,000 | dot pattern |
| 193 nm | 3.9 mJ/cm² | vertical | 600 | vertical ripples (weak) |
| 193 nm +193 nm | 3.9 mJ/cm² 3.9 mJ/cm² | vertical horizontal | 600 600 | dot pattern (weak) |

Table 2 lists the smallest and largest fluences for which periodic structures were still observed after 1,000 pulses at a repetition rate of 3 Hz. The substrates used were commercial Mylar PET films (from 10 to 50 $\mu m$ thick) and thin PET films (from 100 to 170 nm thick) on silicon wafers.

TABLE 2

| | 193 nm | | 248 nm | |
|---|---|---|---|---|
| | min. fluence | max. fluence | min. fluence | max. fluence |
| Mylar | 3.5 mJ/cm² | 5.5 mJ/cm² | <10 mJ/cm² | 14.8 mJ/cm² |
| PET film | 3 mJ/cm² | 5 mJ/cm² | 4 mJ/cm² | 10.5 mJ/cm² |

The structures produced are heat-resistant to 140° C.

EXAMPLE 2

200 nm thick Cr lower layers, subsequently 50 nm thick Co—Ni—Cr layers and finally 20 nm thick carbon protective layers were applied by sputtering in an Ar plasma to 50 $\mu m$ thick PET films (Mylar 200 D from DuPont) in a commercial sputtering unit. The PET films were either not subjected to any pretreatment prior to coating or were exposed to an excimer laser at a wavelength of 248 nm with energy densities of from 10 to 15 mJ/cm² and 1,000 pulses in each case, in each of the two polarization directions, according to the novel process.

For the patterns obtained in each case, the peel force was determined as a measure of the adhesive strength in a peel test (inverse 180° EAA peel test; P. Phuku, P. Bertrand, Y. De Puydt, Thin Solid Films 200 (1991), 263). It was found that an unexposed sample had an adhesion of 3 N/cm whereas exposed samples had the maximum measurable peel force of 4.5 N/cm, ie. the adhesion is improved by exposure to such an extent that the upper test limit of the peel test is reached.

EXAMPLE 3

Reduction in friction

The procedure was as in Example 2 and the PET film was exposed to a KrF excimer laser (248 nm) at 7.5 mJ/cm$^2$ and 1,000 pulses in each polarization direction, after which the Cr lower layer and the Co—Ni—Cr magnetic layer were applied by sputtering. When the coefficient of superquasistatic friction (SQF) was measured, it was found that the UV-pretreated medium had a coefficient of friction which was about 20% lower than that of a reference sample which was untreated but otherwise had the same composition.

EXAMPLE 4

Improvement in the wear behavior

To assess the effect of the UV pretreatments on the tribological properties, still measurements were carried out using Co—Ni—Cr layers with Cr lower layers on pretreated Mylar films. First a signal (10 kfci) was recorded on the medium and then the drop in output level as a function of time was monitored on a drum tester in which the stationary head is in contact with the medium rotating underneath it and clamped in the form of a circle. A playback signal decreasing monotonically with time was recorded until the magnetic layer had been completely rubbed away down to the film and a playback signal was no longer detectable. Mylar 200 D-PET films (inner surface) were pretreated with an excimer laser at 193 nm, after which a 200 nm thick Cr lower layer and, thereon, a 50 nm thick Co—Ni—Cr layer were applied by sputtering. The chosen laser fluence was 3.9 mJ/cm$^2$. Exposure was effected in both polarization directions with 600 and 1,000 pulses each, so that dot patterns were formed in each case. The layers were lubricated with Fomblin Z-DOL and were subjected to the still picture test. Compared with unexposed reference samples, longer still lives and a substantially reduced drop in output level were obtained, Considerably more revolutions were possible on exposed-surfaces than on the unexposed surfaces of the same sample, until the layer had been completely rubbed away.

While still lives of only a few minutes or less are frequently observed on unexposed surfaces before complete disappearance of the signal, still lives of several hours can be obtained on exposed surfaces. The playback signal on the exposed surfaces is always greater than on the surfaces which have not been pretreated. Optical micrographs show flaking of the magnetic layer on unexposed surfaces along the head track. Delamination of the layer over large areas frequently occurs particularly at the edge of the track where especially high shear forces are acting and the layer is exposed to high stresses. This destruction makes the medium completely useless, and the signal falls abruptly to zero. On exposed surfaces the abrasion is considerably less and no signals of mechanical damage or destruction along the head track are found under the optical microscope.

Owing to the improved adhesion of the layer, the medium withstands far greater shear forces at the interface, and the decreased friction reduces the stress field and leads to reduced force induction in the case of tribological stress due to the head.

This shows that the fine roughness in the form of dots, produced on the surface of PET by UV exposure, leads to improved still picture behavior, whereas, owing to the large area in contact with the head, the untreated smooth films tend to stick, with the result that the layer is rapidly destroyed and said films therefore have completely inadequate wear properties.

We claim:

1. A process for the production of slight surface roughness on a sheet of polyethylene terephthalate material, which comprises: exposing the sheet to two successive individual exposures to linearly polarized UV radiation, the planes of polarization of the two successive individual exposures to a pulsed excimer laser in the wavelength range of from 150 to 400 nm making an angle of from 20° to 90° with one another, whereby surface roughness is obtained consisting of dot patterns in the submicron range having a diameter of 10 to 200 nm and whereby the surface roughness is obtained without removing any material from the sheet.

2. A process as defined in claim 1, wherein each of the two successive individual exposures is effected at a wavelength of 248 nm using an energy density of from 1 to 15 mJ/cm$^2$ and more than 200 pulses per unit area.

3. A process as defined in claim 2 wherein each of the two successive individual exposures is effected at a wavelength of 193 nm using an energy density of from 1 to 6 mJ/cm$^2$ and more than 200 pulses per unit area.

* * * * *